(12) United States Patent
deVilliers

(10) Patent No.: US 9,406,526 B2
(45) Date of Patent: Aug. 2, 2016

(54) METHOD FOR PATTERNING CONTACT OPENINGS ON A SUBSTRATE

(71) Applicant: Tokyo Electron Limited, Minato-ku, Tokyo (JP)

(72) Inventor: Anton J. deVilliers, Clifton Park, NY (US)

(73) Assignee: TOKYO ELECTRON LIMITED, Minato-Ku, Tokyo (JP)

( * ) Notice: Subject to any disclaimer, the term of this patent is extended or adjusted under 35 U.S.C. 154(b) by 0 days.

(21) Appl. No.: 14/681,265

(22) Filed: Apr. 8, 2015

(65) Prior Publication Data

US 2015/0294878 A1 Oct. 15, 2015

Related U.S. Application Data

(60) Provisional application No. 61/977,864, filed on Apr. 10, 2014.

(51) Int. Cl.
*H01L 21/311* (2006.01)
*H01L 21/027* (2006.01)

(52) U.S. Cl.
CPC ...... *H01L 21/31144* (2013.01); *H01L 21/0273* (2013.01)

(58) Field of Classification Search
CPC ............ H01L 21/0273; H01L 21/0337; H01L 21/0338; H01L 21/308–21/3088; H01L 21/3114
See application file for complete search history.

(56) References Cited

U.S. PATENT DOCUMENTS

| 8,530,147 | B2 | 9/2013 | Yang | |
|---|---|---|---|---|
| 2008/0261384 | A1 | 10/2008 | Sun et al. | |
| 2009/0142711 | A1 | 6/2009 | Jung et al. | |
| 2010/0130016 | A1* | 5/2010 | DeVilliers | ........... H01L 21/0273 438/703 |
| 2014/0004705 | A1 | 1/2014 | Kang et al. | |

FOREIGN PATENT DOCUMENTS

KR 10-2007-0004234 1/2007

OTHER PUBLICATIONS

International Patent Application No. PCT/US2015/024921, "International Search Report and Written Opinion," mailed Jul. 27, 2015, International Filing Date Apr. 8, 2015.

\* cited by examiner

*Primary Examiner* — Daniel Shook
(74) *Attorney, Agent, or Firm* — DLA Piper LLP US

(57) ABSTRACT

Techniques herein include methods for patterning substrates including methods for patterning contact openings. Using techniques herein, slot contacts and other openings can be created having a selectable width between approximately 1-30 nanometers or less. Methods include creating trench widths defined by diffusion lengths of photo acid as part of a double patterning scheme. These trenches can then be filled and a separate mask can then be used to isolate segments of trenches. The segments can then be extruded resulting in slot contact openings which are ready to be metallized. These slot contacts have a length defined by lithographic exposure techniques and a width defined by photo acid diffusion lengths.

27 Claims, 6 Drawing Sheets

METHOD FOR PATTERNING CONTACT OPENINGS ON A SUBSTRATE

CROSS REFERENCE TO RELATED APPLICATIONS

The present application claims the benefit of U.S. Provisional Patent Application No. 61/977,864, filed on Apr. 10, 2014, entitled "Method for Patterning Contact Openings on a Substrate," which is incorporated herein by reference in its entirety.

BACKGROUND OF THE INVENTION

This invention relates to microfabrication including microfabrication of integrated circuits as well as processes involved in patterning semiconductor substrates.

In material processing methodologies (such as photolithography), creating patterned layers typically involves the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure creates a latent pattern within the radiation-sensitive material which can then be developed. Developing refers to dissolving and removing a portion of the radiation-sensitive material to yield a topographic or physical pattern. For example, developing can include removal of irradiated regions of the radiation-sensitive material (as in the case of positive photoresist), or non-irradiated regions (as in the case of negative resist) using a developing solvent. The topographic pattern can then function as a mask layer.

Preparation and development of various films used for patterning can include thermal treatment or baking. For example, a newly applied film can require a post-application bake (PAB) to evaporate solvents and/or to increase structural rigidity or etch resistance. Also, a post-exposure bake (PEB) can be executed to set a given pattern to prevent further dissolving. Fabrication tools for coating and developing substrates typically include one or more baking modules. Some lithography processes include coating a wafer with a thin film of Bottom Anti-reflective Coating (BARC), followed by coating with a resist, and then exposing the wafer to a pattern of light as a process step for creating microchips. BARC is a thin film that is typically placed between the substrate and the resist layer to absorb remaining light rays during an exposure. This is to prevent rough edges created by reflected light rays during exposure. BARC is also used between multiple layer exposures to protect the previously created layers from being exposed again.

SUMMARY

Conventional lithographic techniques for exposing a pattern of radiation or light onto a substrate have various challenges that limit a size of features exposed, and limit pitch or spacing between exposed features. Because of the limited resolution that is feasible using photolithographic exposure, various approaches have been introduced to pattern films beyond the resolution of what exposure tools can reliably provide. These techniques are known as double patterning, pitch multiplication (pitch density multiplication to be accurate), or sub-resolution patterning. These approaches can allow patterning of smaller features at a smaller pitch than what is currently possible with conventional lithographic techniques. There are various double patterning approaches, for example, Litho/Etch/Litho/Etch (LELE), Litho/Litho/Etch (LLE), Litho/Freeze/Litho/Etch (LFLE) have been used. These patterning approaches reduce feature size, but still have challenges.

One challenge with fabricating smaller feature sizes is to pattern very small contact openings including slot-shaped or elongated openings for subsequent metallization. For example, current design efforts desire to have slot contacts with widths less than about 10-30 nanometers. Conventional exposure techniques alone, however, can only reliably pattern openings down to about 50-60 nanometers in width. Techniques disclosed herein, however, enable patterning of features and contact openings having widths less than about 1 nanometer. Of course, widths in the 1-50 nanometer range can also be realized with these techniques. Techniques herein include a double patterning process. In general, this patterning process involves double patterning an imaged line into smaller lines using two photoresist layers. A third photoresist layer can then be added, reimaged, and then etched to create slot contact openings. The advantage of techniques herein is that a given size of contact openings can be controlled by resist type and the post exposure bake (PEB) treatment.

Example embodiments include a method for patterning a substrate. Such a patterning method can include several steps. A substrate is received or provided having a target layer, a pattern-transfer layer is positioned on the target layer, and a first photoresist layer is positioned on the pattern-transfer layer. The first photoresist layer is a first patterned layer defining a topographic (physical) pattern. The first photoresist layer includes a solubility-changing agent. A second photoresist layer is deposited on the first patterned layer filling in the topographic pattern. Photo acid generated in the first patterned layer is then caused to diffuse into a first portion of the second photoresist layer. This diffusion is such that the first portion of the second photoresist layer changes its solubility. The second photoresist layer is developed such that the first portion of the second photoresist layer is removed resulting in the second photoresist layer and the first photoresist layer together defining a second patterned layer. This second patterned layer is then transferred into the pattern-transfer layer via a first etch process. The first photoresist layer and the second photoresist layer are removed resulting in the pattern-transfer layer defining a third patterned layer.

The third patterned layer can include various line patterns or trenches with very narrow widths, with such widths being controlled by photo acid diffusion lengths. Trenches in the third patterned layer can be filed with a planarizing material. The filed patterned layer can then be masked with an additional photoresist mask that exposes only selected locations of the filed trenches. This additional masked pattern can then be transferred to the target layer via one or more etch processes. Such techniques can create slot-shaped openings (or opening of other shapes) that have widths substantially smaller than what exposure tools alone can reliable fabricate. Thus, techniques herein can provide sub-resolution slot contacts and other sub-resolution features.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include methods for patterning substrates including methods for patterning contact openings. Using techniques herein, slot-shaped contacts (slot contacts) can be created having a width less than approximately 1 nm. Methods include creating trench widths defined by diffusion lengths of photo acid as part of a double patterning scheme. These trenches can then be filled and a separate mask can be used to isolate segments of trenches, thereby creating slot contacts. The segments can then be extruded resulting in slot contact openings which are ready to be metallized. These slot contacts have a length defined by lithographic exposure techniques and a width defined by photo acid diffusion lengths.

Techniques herein can be used for patterning various features, lines, and contacts. In other words, patterning techniques herein can be used for creating transistor structures, memory arrays, slot contacts, and other features associated with microfabrication of semiconductor devices. For convenience in describing methods herein, exemplary embodiments will primarily be described in the context of creating slot contact openings for metallization of logic and memory structures. Nevertheless, those skilled in patterning technologies will readily recognize applications beyond creating slot contacts.

Figure 1:
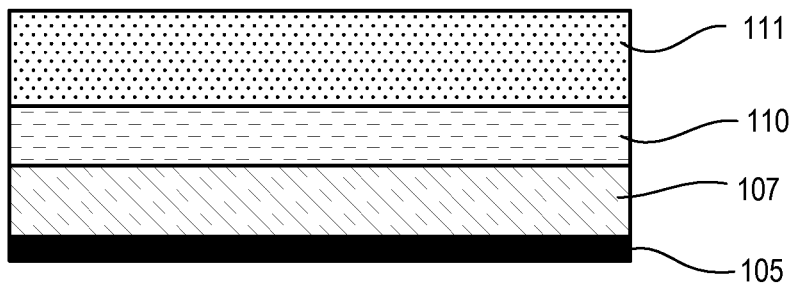
FIG. 1 is a schematic, cross-sectional side view of an example substrate stack to be patterned according to embodiments described herein.

Accordingly, techniques herein include methods for patterning a substrate. Referring now to FIG. 1, a substrate 105 is received, provided, or created having a stack of layers or films. Substrate 105 includes a target layer 107 positioned on the substrate 105. Note that the substrate 105 can include additional layers and features below target layer 107. A pattern-transfer layer 110 is positioned on the target layer 107. A first photoresist layer 111 is positioned on the pattern-transfer layer 110. The first photoresist layer 111 can be deposited via conventional means such as spin-on coating. Note that photoresists used herein can be any radiation-sensitive material including materials that respond to electromagnetic radiation outside of the visible spectrum.

Each of these layers can be selected from various types of materials. For example, target layer 107 can be a low-k material or other electrically insulating material. By way of a non-limiting example, the pattern-transfer layer 110 can comprise one or more materials such as silicon, silicon oxynitride (SiON), organic material, non-organic material, and amorphous carbon. Pattern-transfer layer 110 can also be selected to have anti-reflective properties such as by using a silicon bottom anti-reflective coating (Si-BARC). First photoresist layer 111 can be a negative tone resist (NTR) or a positive tone resist (PTR). First photoresist layer 111 can include a solubility-changing agent. The solubility-changing agent can be a photo acid generator such as a temperature-activated generator or temperature acid generator (TAG). A photo acid generator can be temperature-activated in that heating the solubility-changing agent above a threshold temperature causes photo acid to be generated within photoresist layer 111.

The first photoresist layer 111 can then be exposed to a pattern of light or electromagnetic radiation according to conventional lithographic exposure techniques. During lithographic exposure a latent pattern is created within first photoresist layer 111. This latent pattern can be developed using one or more developing agents that correspond to a particular type of photoresist selected. For example, tetramethylammonium hydroxide (TMAH) can be used to dissolve and remove portions of first photoresist layer 111.

Figure 2:
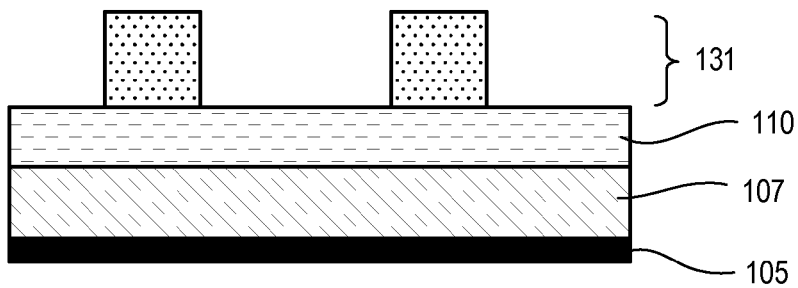
FIG. 2 is a schematic, cross-sectional side view of an example substrate after developing a latent pattern, according to embodiments described herein.

FIG. 2 shows a cross-sectional schematic view of a segment of the substrate stack showing the result of lithographic exposure and developing. The result is first patterned layer 131. Note that a selected solubility-changing agent (deposited in or with initial photoresist application) can remain dormant during photolithographic exposure operations and thus not participate in conventional de-protection of a photoresist. In some embodiments, the process flow can begin with receiving the substrate 105 already having first patterned layer 131, which defines a topographic pattern, that is, a physical pattern. At this point, first patterned layer 131 can be optionally be baked to harden the photoresist.

Figure 3:
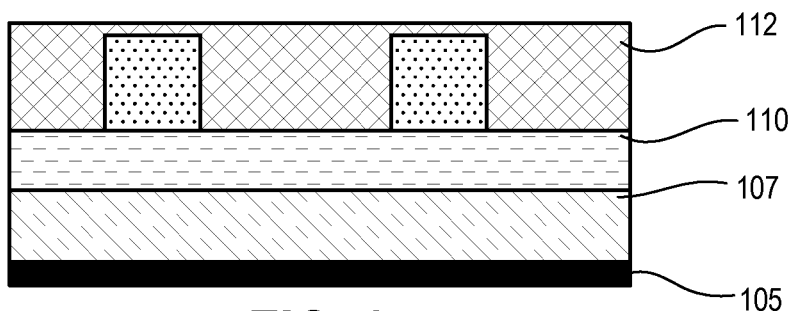
FIG. 3 is a schematic, cross-sectional side view of an example substrate after depositing a second photoresist layer, according to embodiments described herein.

Referring now to FIG. 3, a second photoresist layer 112 is deposited on the first patterned layer 131. The second photoresist layer 112 is deposited such that photoresist material at least partially fills trenches and other openings defined by first patterned layer 131. In typical embodiments photoresist material will be deposited via a spin-on technique which means that photoresist will fill-in and flow over existing physical structures leaving some overburden on top of existing structures in first patterned layer 131.

Figure 4A:
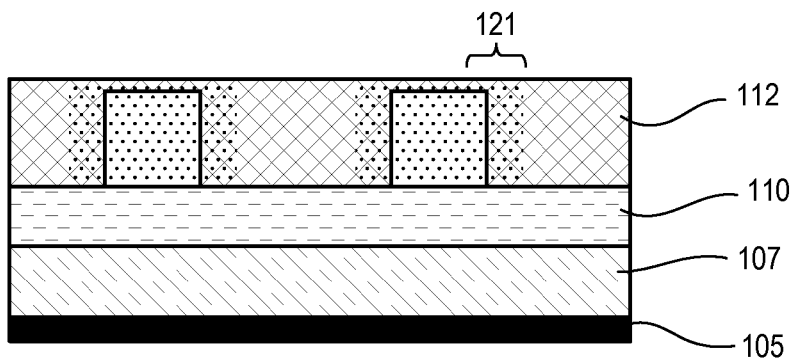
FIG. 4A is a schematic, cross-sectional side view of an example substrate after photo acid diffusion, according to embodiments described herein.

Referring now to FIG. 4A, with a second photoresist layer 112 deposited diffusion operations can commence. Photo acid generated in the first patterned layer 131 is caused to diffused into a first portion of the second photoresist layer 112 such that this first portion of the second photoresist layer 112 changes its solubility relative to one or more given solvents. Causing such diffusion into the first portion of second photoresist layer 112 results in photo acid diffusion of a predetermined distance 121 into the second photoresist layer 112. Predetermined distance 121 can be selected by selecting a particular molecular weight of a photo acid generator that results in a specific length of diffusivity at a particular temperature. In other words, a length that a particular photo acid will diffuse into second photoresist layer 112 depends on molecular weight of a photo acid, baking temperature, and heating time. Causing photo acid generated to initiate diffusion can comprise heating the first patterned layer 131. Heating the first patterned layer 131 can include heating to a first predetermined temperature that causes the solubility-changing agent to generate photo acid within the first patterned layer 131. Heating the first patterned layer 131 can include heating to a second predetermined temperature. Reaching the second predetermined temperature causes a cross-linking agent within the first patterned layer to alter the first patterned layer such that the first patterned layer is no longer dissolvable by a specific resist developer. Using a cross-linking agent can help prevent the photo acid from changing a solubility of the first patterned layer itself.

Note that the photo acid can be created at various stages in this patterning method. For example, photo acid can be created at a time of heating specified to cause diffusion so that photo acid creation and photo acid diffusion are approximately simultaneous. Optionally, photo acid can be created in advance of photo acid diffusion operations. For example, in a step immediately before or after FIG. 2, photo acid can be generated. The photo acid generated will stay in a photoresist until heated again In the example above a cross-linking agent can be activated at a time of photo acid diffusion. In other embodiments, the cross-linking agent can be activated prior to deposition of second photoresist layer 112 or prior to initiating of diffusion. Note that using a cross-linker is optional. Using a cross-linker can be replaced by using a different solvent and resist scheme. For example, using NTD develop, because such a selection can also provide a strengthened resist with the option of using a different developer species that does not participate in the solubility of the first resist. In another example, photoresist can be alcohol-based, and then followed by using an NTD resist. Thus, in one scheme a cross-linking agent can be used, whereas in another scheme an incompatibility of a developer to wash away the first patterned layer can be used by using a different solvent system for a second patterned layer.

Thus, other embodiments can activate the solubility-changing agent prior to depositing the second photoresist layer such that the solubility-changing agent generates photo acid within the first photoresist layer. Activating the solubility-changing agent can include heating the substrate. Heating can be accomplished via various techniques such as conductive heating, convection heating, laser application, and electromagnetic radiation application, and so forth. Optionally, activating the solubility-changing agent can also include hardening the first photoresist layer such that the photoresist is no longer dissolvable by a specific developer. Such hardening can include activating a cross-linking agent. In some embodiments, the solubility-changing agent can be selected to have a higher activation temperature than a cross-linking agent. This means that heat activation steps can be combined with a cross-linking agent hardening photoresist before a photo acid is generated and has a chance to de-protect the first photoresist.

Figure 4B:
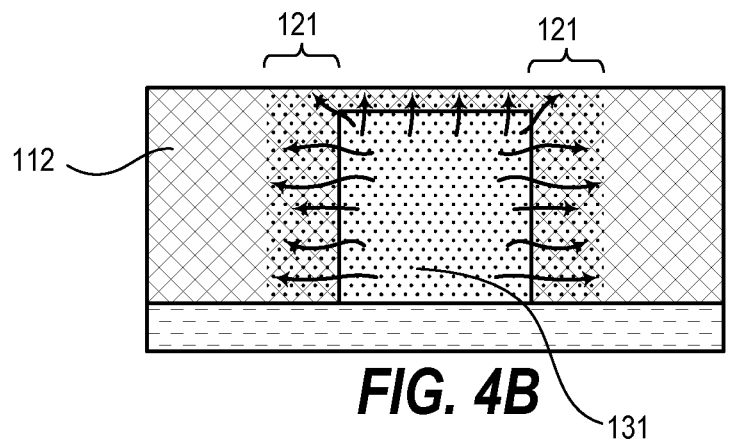
FIG. 4B is a schematic, cross-sectional enlarged side view of an example substrate after photo acid diffusion, according to embodiments described herein.

FIG. 4B shows an enlarged segment of a diffusion portion. As can be seen, photo acid diffuses outwardly from first patterned layer 131 into second photoresist layer 112, The photo acid diffuses a known depth or distance based on molecular weight, temperature, and bake time. The photo acid de-protects a generally rectangular-shaped portion of the second photoresist layer on either side of a first photoresist and above the first photoresist (which de-protects any overburden).

Figure 5:
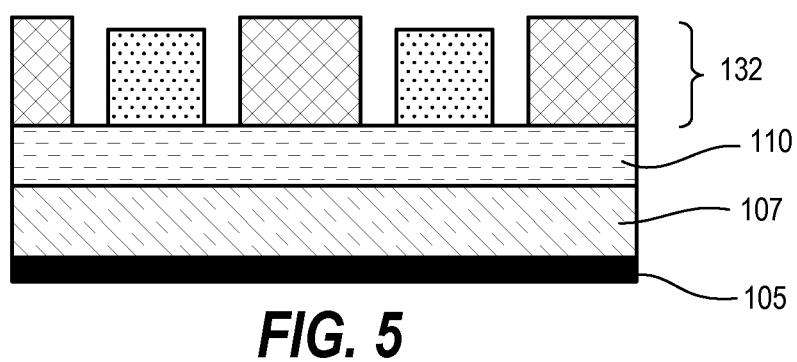
FIG. 5 is a schematic, cross-sectional side view of an example substrate after developing diffused portions, according to embodiments described herein.
Figure 6:
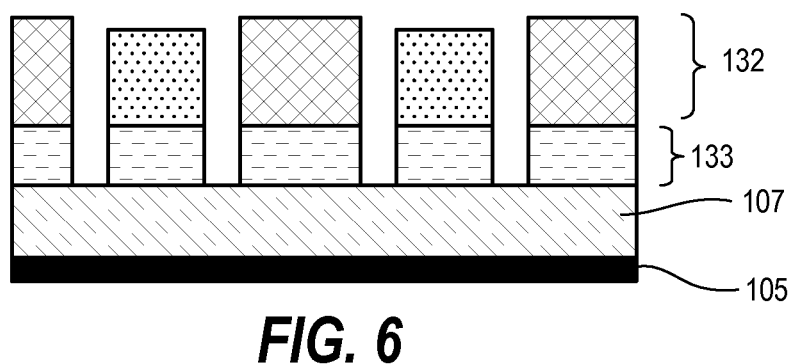
FIG. 6 is a schematic, cross-sectional side view of an example substrate after transferring a combined photoresist pattern into an underlying layer, according to embodiments described herein.
Figure 7:
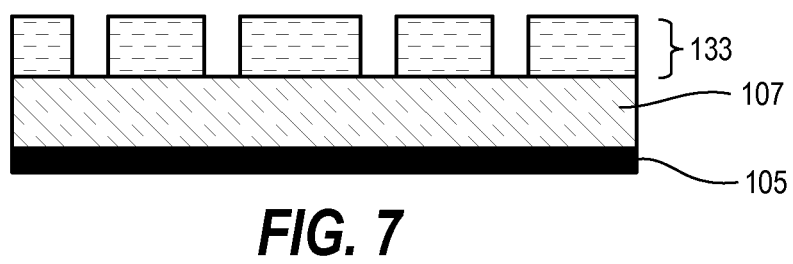
FIG. 7 is a schematic, cross-sectional side view of an example substrate having a patterned layer after removing photoresist layers, according to embodiments described herein.

Next, the second photoresist layer 112 is developed such that the first portion of the second photoresist layer 121 is removed resulting in the second photoresist layer and the first photoresist layer together defining a second patterned layer 132, as shown in FIG. 5. This second patterned layer 132 is transferred into the pattern-transfer layer 110 such as via an etch operation resulting in the pattern-transfer layer 110 now defining a third patterned layer 133 as shown in FIG. 6. Any remaining portions of first photoresist layer 111 and second photoresist layer 112 can be removed resulting in the pattern-transfer layer 110 defining a third patterned layer 133 as shown in FIG. 7.

One benefit of this process flow is making very narrow trenches as compared to lines initially created by lithographic imaging operations. These trenches can be used for various applications such as for making slot contacts as will be described below. In the flow described above critical dimensions for these narrow trenches are defined by diffusion length of photo acid, and such diffusion length can be precisely controlled to a specified number of nanometers or even tenths of nanometers. At this point any subsequent application flow or double processing flow can be executed.

Figure 8:
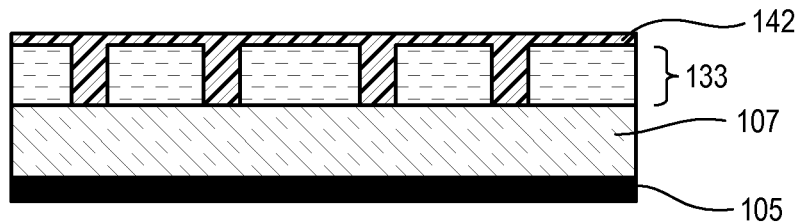
FIG. 8 is a schematic, cross-sectional side view of an example substrate after filling a topographic pattern, according to embodiments described herein.

One beneficial continued application is to make slot contacts. Using these narrow trenches to create slot contacts involves an additional patterning and masking steps. Referring now to FIG. 8, a planarization layer 142 can be deposited on the third patterned layer 133 such that defined openings in the third patterned layer 133 are filled. The planarization layer 142 can be deposited as an overcoat that not only fills define trenches but can also cover structures of third patterned layer 133. The planarization layer can comprise an anti-reflective coating, and can include an organic material or nonorganic material. In some embodiments selection of material for planarization layer 142 can be based on etch selectivities of the third patterned layer 133 relative to the planarization layer 142. By way of a specific example, if third patterned layer 133 is a silicon-containing anti-reflective coating, then the planarization layer 142 can be selected as an organic anti-reflective coating.

Figure 9:
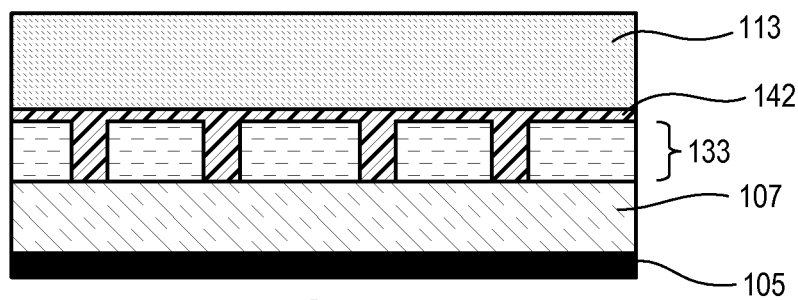
FIG. 9 is a schematic, cross-sectional side view of an example substrate after depositing a third layer of photoresist, according to embodiments described herein.
Figure 10:
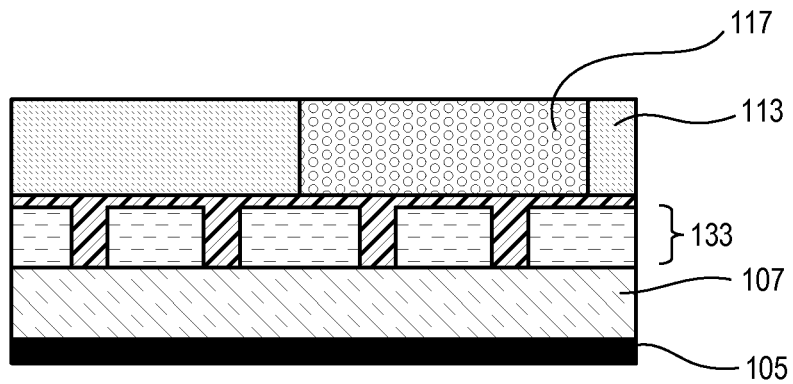
FIG. 10 is a schematic, cross-sectional side view of an example substrate after being exposed to a pattern of radiation, according to embodiments described herein.
Figure 11:
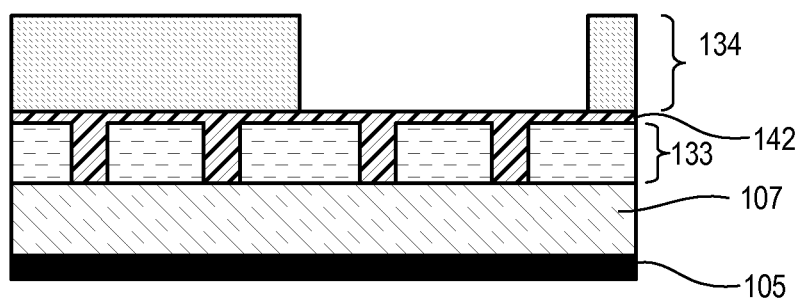
FIG. 11 is a schematic, cross-sectional side view of an example substrate after developing a third layer of photoresist, according to embodiments described herein.

In FIG. 9, a third photoresist layer 113 is deposited on the planarization layer 142. Third photoresist layer 113 can then be exposed to a pattern of electromagnetic radiation such that a latent pattern 117 is created within third photoresist layer 113, as shown in FIG. 10. This latent or exposed pattern is then developed such that the third photoresist layer 113 results in a fourth patterned layer 134 defining a topographic or physical pattern, as shown in FIG. 11.

Figure 12A:
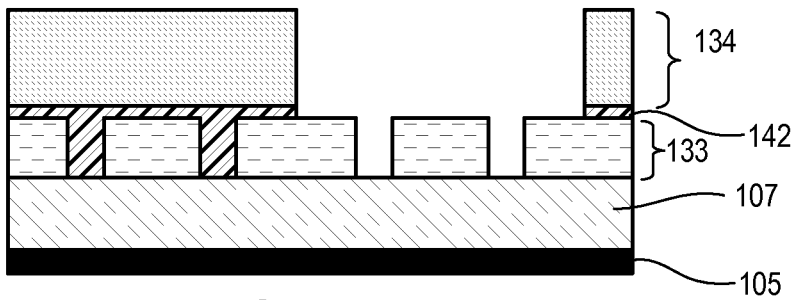
FIG. 12A is a schematic, cross-sectional side view of an example substrate after etching exposed portions of filled lines, according to embodiments described herein.
Figure 12B:
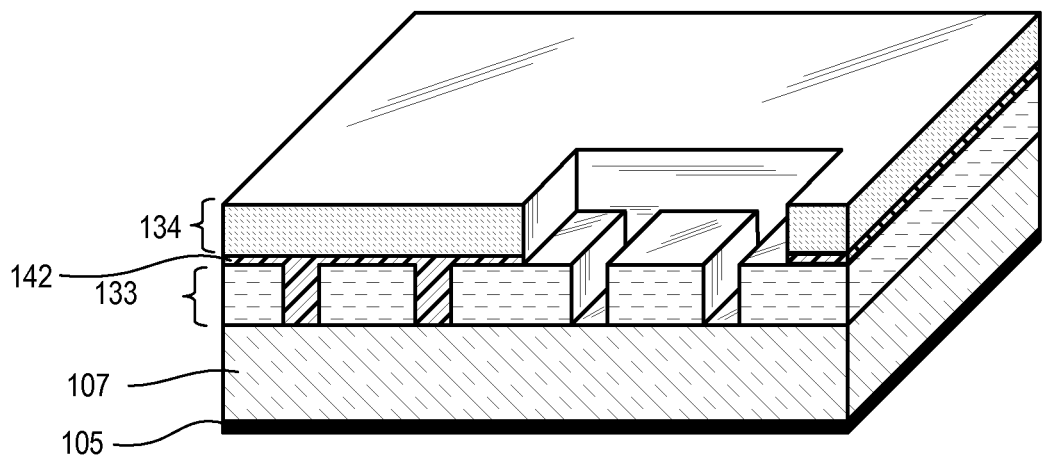
FIG. 12B is a schematic, perspective view of an example substrate after etching exposed portions of filled lines, according to embodiments described herein.
Figure 13:
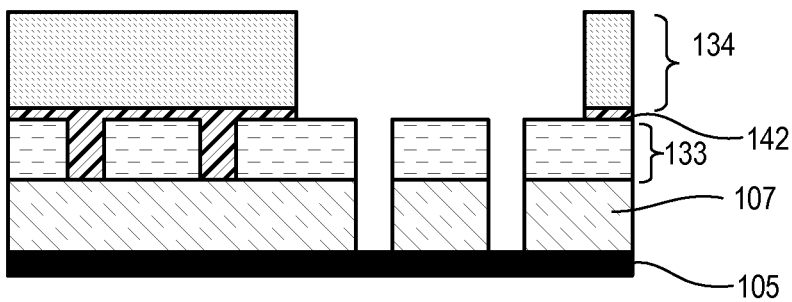
FIG. 13 is a schematic, cross-sectional side view of an example substrate after transferring exposed and etched lines into a target layer, according to embodiments described herein.
Figure 14A:
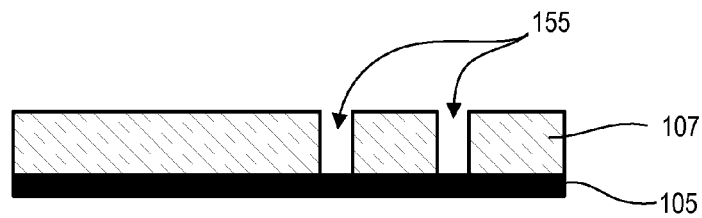
FIG. 14A is a schematic, cross-sectional side view of an example substrate after removing patterning layers above a target layer, according to embodiments described herein.
Figure 14B:
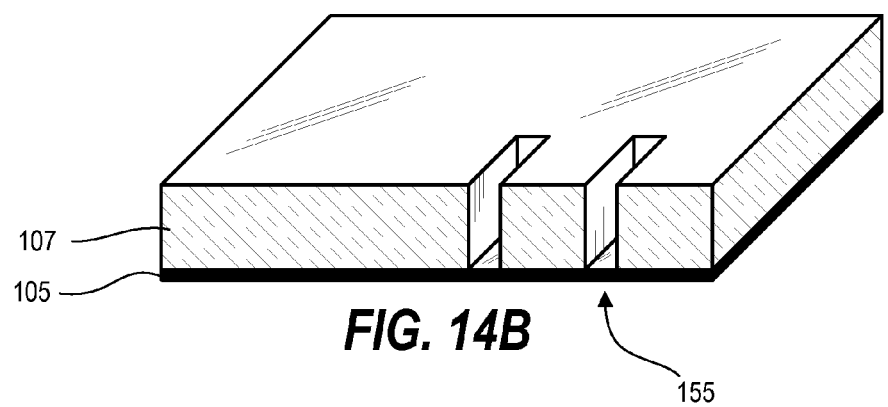
FIG. 14B is a schematic, perspective view of an example substrate after removing patterning layers above a target layer, according to embodiments described herein.

A second etch process can then be executed that etches portions of the planarization layer 142 exposed by the fourth patterned layer 134. This etch process uses a chemistry that etches exposed portions of the planarization layer 142 without substantially etching exposed portions of third patterned layer 133, as shown in FIG. 12A. FIG. 12B shows a perspective view of a given substrate segment from FIG. 12A that has been etched. Note that narrow slot-shaped openings are now defined that can be transferred to underlying layers. Such transfer can be accomplished either as a separate etch operation, or as a continuous etch operation, with any corresponding chemistry and etch parameters being adjusted. Upon completion of this etch operation, slot contact openings are transferred into target layer 107 as shown in FIG. 13. Any remaining layers above target layer 107 that were not consumed in an etch process can then be removed leaving a patterned target layer as shown in FIGS. 14A and 14B, which shows a pair of defined slot contact openings 155.

Figure 15:
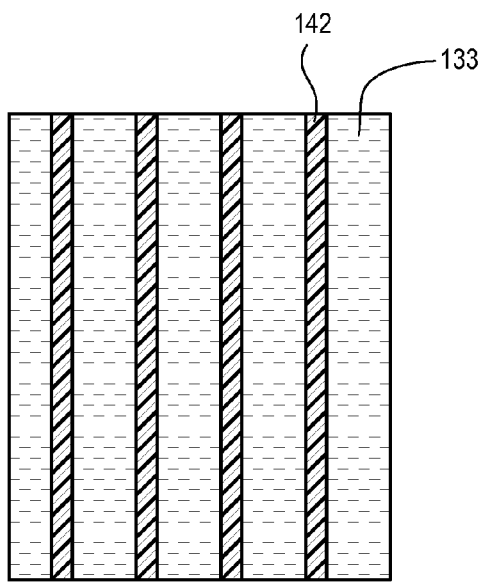
FIG. 15 is a schematic, top view of an example substrate after filling a topographic pattern of lines, according to embodiments described herein.

FIGS. 15-20 are schematic top view diagrams illustrating an abbreviated version of the previously-described process. FIG. 15 corresponds to FIG. 8 except that, for convenience, planarization layer 142 is not shown completely covering patterned layer 133. In other words, FIG. 15 shows a first material defining very narrow trenches filled in by a second material. These trenches can be created such as by following process flow as described in the description of FIGS. 1-7.

Figure 16:
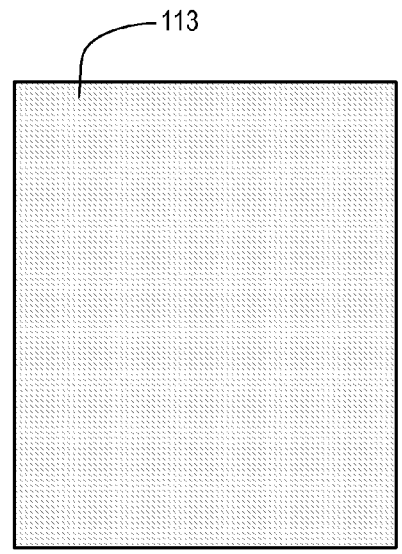
FIG. 16 is a schematic, top view of an example substrate after depositing a third layer of photoresist, according to embodiments described herein.
Figure 17:
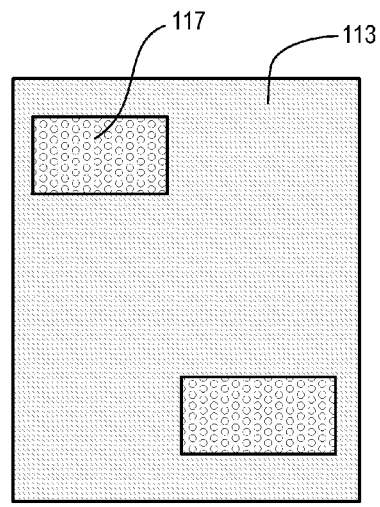
FIG. 17 is a schematic, top view of an example substrate after being exposed to a pattern of radiation, according to embodiments described herein.

FIG. 16 corresponds to FIG. 9 in which a third photoresist layer 113 has been deposited on top of the substrate covering underlying layers, After completing any post-application bake steps, third photoresist layer 113 is exposed to a pattern of radiation such as by using a photolithography tool. This exposure creates a latent pattern 117 which can be embodied shapes at particular locations on a substrate having a changed solubility as shown in FIG. 17.

Figure 18:
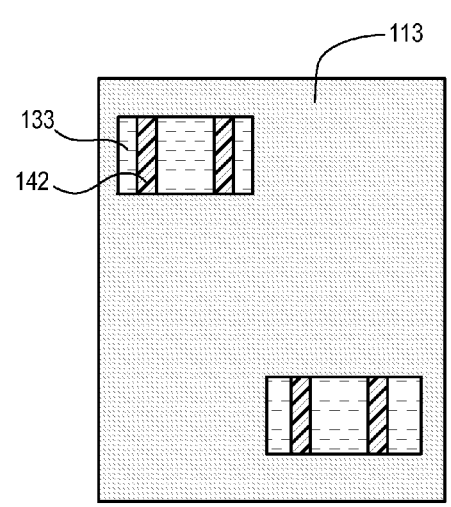
FIG. 18 is a schematic, top view of an example substrate after developing a third layer of photoresist, according to embodiments described herein.
Figure 19:
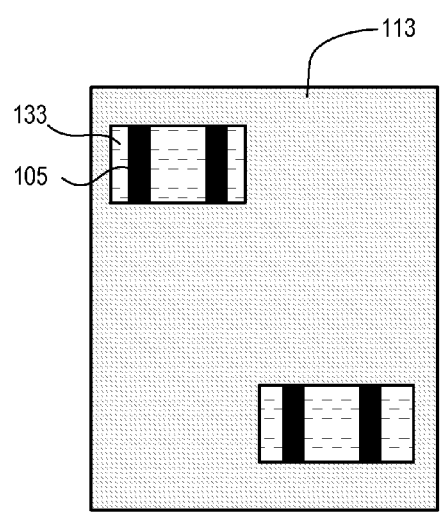
FIG. 19 is a schematic, top view of an example substrate after etching exposed portions of filled lines and etching a target layer, according to embodiments described herein.
Figure 20:
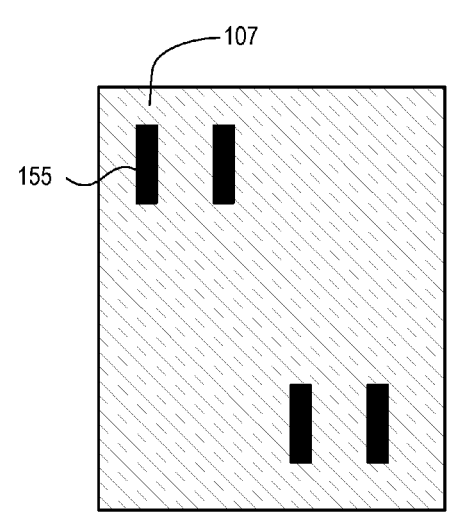
FIG. 20 is a schematic, top view of an example substrate after removing patterning layers above a target layer defining contact openings, according to embodiments described herein.

A photoresist developing step is then executed which dissolves and removes portions of photoresist layer 113 defined by an exposure pattern. FIG. 18 shows a result of such a developer step. Note that this developing step reveals specific segments of underlying lines. In other words, a majority of the underlying lines are masked by photoresist layer 113 except for selected portions which are exposed as viewed from a top view. With these line segments now exposed, an etch process can be executed that exhumes or etches away exposed line segments. This can include etching through the planarization layer 142 and into the target layer 107. FIG. 19 shows a result of etching through both layers with segments of the substrate 105 visible through the mask layer stack. Any remaining layers that were not consumed during etch processes can then be removed resulting in slot contact openings 155 defined by target layer 107, as shown in FIG. 20.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
    receiving a substrate having a target layer, a pattern-transfer layer positioned on the target layer, and a first photoresist layer positioned on the pattern-transfer layer, the first photoresist layer being a first patterned layer defining a topographic pattern, the first photoresist layer including a solubility-changing agent;
    depositing a second photoresist layer on the first patterned layer;
    causing photo acid generated in the first patterned layer to diffuse into a first portion of the second photoresist layer such that the first portion of the second photoresist layer changes its solubility;
    developing the second photoresist layer such that the first portion of the second photoresist layer is removed resulting in the second photoresist layer and the first photoresist layer together defining a second patterned layer;
    transferring the second patterned layer into the pattern-transfer layer via a first etch process and removing the first photoresist layer and the second photoresist layer resulting in the pattern-transfer layer defining a third patterned layer; and
    depositing a planarization layer on the third patterned layer such that defined openings in the third patterned layer are filled.

2. The method of claim 1, wherein the planarization layer comprises an anti-reflective coating.

3. The method of claim 1, wherein the planarization layer comprising an organic material.

4. The method of claim 1, further comprising: depositing a third photoresist layer on the planarization layer and developing an exposed pattern such that the third photoresist layer results in a fourth patterned layer defining a topographic pattern.

5. The method of claim 4, further comprising executing a second etch process that etches portions of the planarization layer exposed by the fourth patterned layer, the etch process using a chemistry that etches exposed portions of the planarization layer without substantially etching exposed portions of the pattern-transfer layer.

6. The method of claim 5, wherein the chemistry is selected to etch organic material without substantially etching silicon-containing material.

7. The method of claim 5, further comprising: transferring exposed portions of the third patterned layer into the target layer.

8. The method of claim 1, wherein causing photo acid generated in the first patterned layer to diffuse into the first portion of the second photoresist layer results in the photo acid diffusing a predetermined distance into the second photoresist layer.

9. The method of claim 1, wherein causing photo acid generated in the first patterned layer to diffuse into the first portion of the second photoresist layer comprises heating the first patterned layer.

10. The method of claim 9, wherein heating the first patterned layer includes heating to a first predetermined temperature that causes the solubility-changing agent to generate photo acid within the first patterned layer.

11. The method of claim 9, wherein heating the first patterned layer includes heating to a second predetermined temperature that causes a crosslinking agent within the first patterned layer to alter the first patterned layer such that the first patterned layer is no longer dissolvable by a specific resist developer.

12. The method of claim 1, wherein the solubility-changing agent is a photo acid generator.

13. The method of claim 12, wherein the photo acid generator is temperature activated in that heating the solubility-changing agent above a threshold temperature causes photo acid to be generated.

14. The method of claim 1, wherein the pattern-transfer layer comprises material selected from the group consisting of silicon, silicon oxynitride (SiON), organic material, non-organic material, and amorphous carbon.

15. The method of claim 14, wherein the pattern-transfer layer comprises an anti-reflective material.

16. A method for patterning a substrate, the method comprising:
    receiving a substrate having a target layer, a pattern-transfer layer positioned on the target layer, and a first photoresist layer positioned on the pattern-transfer layer, the first photoresist layer being a first patterned layer defining a topographic pattern, the first photoresist layer including a solubility-changing agent;
    activating the solubility-changing agent such that the solubility-changing agent generates photo acid within the first patterned layer;
    after activating the solubility-changing agent, depositing a second photoresist layer on the first patterned layer;
    causing photo acid generated in the first patterned layer to diffuse into a first portion of the second photoresist layer such that the first portion of the second photoresist layer changes its solubility;
    developing the second photoresist layer such that the first portion of the second photoresist layer is removed resulting in the second photoresist layer and the first photoresist layer together defining a second patterned layer; and
    transferring the second patterned layer into the pattern-transfer layer via a first etch process and removing the first photoresist layer and the second photoresist layer resulting in the pattern-transfer layer defining a third patterned layer.

17. The method of claim 16, wherein activating the solubility-changing agent includes heating the substrate.

18. The method of claim 17, wherein heating the substrate includes using a heating process selected from the group consisting of conductive heating, convection heating, laser application, and electromagnetic radiation application.

19. The method of claim 16, wherein activating the solubility-changing agent includes hardening the first patterned layer such that the first patterned layer is no longer dissolvable by a specific developer.

20. The method of claim 16, wherein causing photo acid generated in the first patterned layer to diffuse into the first portion of the second photoresist layer results in the photo acid diffusing a predetermined distance into the second photoresist layer.

21. The method of claim 16, wherein causing photo acid generated in the first patterned layer to diffuse into the first portion of the second photoresist layer comprises heating the first patterned layer.

22. The method of claim 21, wherein heating the first patterned layer includes heating to a first predetermined temperature that causes the solubility-changing agent to generate photo acid within the first patterned layer.

23. The method of claim 21, wherein heating the first patterned layer includes heating to a second predetermined temperature that causes a crosslinking agent within the first patterned layer to alter the first patterned layer such that the first patterned layer is no longer dissolvable by a specific resist developer.

24. The method of claim 16, wherein the solubility-changing agent is a photo acid generator.

25. The method of claim 24, wherein the photo acid generator is temperature activated in that heating the solubility-changing agent above a threshold temperature causes photo acid to be generated.

26. The method of claim 16, wherein the pattern-transfer layer comprises material selected from the group consisting of silicon, silicon oxynitride (SiON), organic material, non-organic material, and amorphous carbon.

27. The method of claim 26, wherein the pattern-transfer layer comprises an anti-reflective material.

* * * * *